United States Patent [19]

Williams et al.

[11] Patent Number: 4,602,209

[45] Date of Patent: Jul. 22, 1986

[54] SWITCH-OFF CIRCUITS FOR TRANSISTORS AND GATE TURN-OFF THYRISTORS

[76] Inventors: Barry W. Williams, 108 Princes Gardens, West Acton, London; Patrick R. Palmer, 394 Newbold Road, Rugby, Warwickshire, both of England

[21] Appl. No.: 605,804

[22] Filed: May 1, 1984

[30] Foreign Application Priority Data

Jun. 24, 1983 [GB] United Kingdom ............... 8317178

[51] Int. Cl.$^4$ ........................................... H03K 17/60
[52] U.S. Cl. ................................ 323/351; 307/252 C; 307/253; 307/300; 323/289
[58] Field of Search ............................... 323/289, 351; 307/252 C, 253, 254, 300, 315

[56] References Cited

U.S. PATENT DOCUMENTS 4,295,059 10/1981 Steigerwald ...................... 307/253
4,549,095 10/1985 Stefani et al. ..................... 307/254

FOREIGN PATENT DOCUMENTS 2403687 8/1975 Fed. Rep. of Germany ...... 307/300
2037114 7/1980 United Kingdom ............... 323/289

OTHER PUBLICATIONS

Hammond et al., "High Power Vector Summation Switching Power Amplifier Development", Power Electronics Specialists Conference, 1981, Boulder Co. USA, (Jun. 29–Jul. 3, 1981), pp. 267–272 (Fig. 4).

Primary Examiner—William H. Beha, Jr.
Attorney, Agent, or Firm—Young & Thompson

[57] ABSTRACT

In order to provide rapid turn-off of a transistor (or thyristor) having its emitter (or cathode) at a floating potential, on drive is removed from the base of the transistor T1 and almost simultaneously a switch SW1 is closed. This causes a proportion of the current which flows through a capacitor C on turn-off of the transistor T1 to flow through a resistor R1 by way of the base of the transistor T1, thus providing a reverse base current which rapidly turns-off the transistor T1. In a practical implementation of this circuit the switching device is a transistor $T_{off}$ and the circuit employs a self-timing approach in which removal of an "on" control signal from the gate of a field-effect transistor T7 automatically actuates the reverse current drive.

5 Claims, 16 Drawing Figures

SWITCH-OFF CIRCUITS FOR TRANSISTORS AND GATE TURN-OFF THYRISTORS

BACKGROUND OF THE INVENTION

This invention relates to circuits for providing rapid turn-off of transistors and gate turn-off thyristors (gto's).

FIGS. 1a and 1b of the accompanying drawings show typical transistor switching circuit configurations using an npn transistor T1 (FIG. 1a) and a pnp transistor T2 (FIG. 1b) respectively. The transistor T1 or T2 is turned on by the application of current across the transistor base-emitter (b-e) junction, in the direction shown by the "on" arrow in FIGS. 1a and 1b. This causes the voltage across the transistor T1 or T2 to fall to near zero and the supply voltage V to be applied across the load causing current to flow from the supply V through both the load and the transistor T1 or T2. In each circuit example the transistor emitter terminal (e) remains at a fixed reference potential, either OV in the case of FIG. 1a or +V in the case of FIG. 1b. Removal of the forward base current will cause the transistor T1 or T2 to turn off. The diode D provides a path for the load current when the transistor T1 or T2 is turned off. For fast turn-off, reverse base current is applied, as shown by the "off" arrow in FIGS. 1a and 1b, which causes the base-emitter junction to cut off very quickly.

Circuits of this type providing forward (on) and reverse (off) base current drive are known. The design of such circuitry is made simple by the fact that the transistor emitter terminal is always at a fixed and stable potential OV or +V.

FIGS. 2a and 2b of the accompanying drawings show two further known transistor switching circuits using an npn transistor T1 (FIG. 2a) and a pnp transistor T2 (FIG. 2b) respectively, but in these cases the transistor emitter terminal is not at a fixed potential OV or +V. In these cases both the base and emitter change potential (relative to, say, the OV rail) when the transistor T1 or T2 switches on and off. The base and emitter are said to be at floating potentials. This effect necessitates more complex circuitry to control the transistor T1 or T2. It is therefore unfortunate that FIG. 2a forms the basis of a very commonly required configuration in bridge circuits. Complex and costly techniques exist for providing the necessary floating on and off base drive for the configurations shown in FIGS. 2a and 2b. These techniques usually involve the use of floating power supplies, optically transmitted control signals, pulse transformers, etc, all of which are necessary to provide voltage isolation for the base and emitter with respect to the OV or +V voltage rails.

A simple turn-on technique exists for the configurations of FIGS. 2a and 2b, as shown in FIGS. 3a and 3b. This involves the use of a pnp-npn Darlington transistor configuration comprising a pnp transistor T3, an npn transistor T5 and resistors R1 and R2 (FIG. 3a), or an npn transistor T4, a pnp transistor T6 and resistors R3 and R4 (FIG. 3b). The switching transistors T3, T4, T5 and T6 can be replaced by field-effect transistors, and the transistor T1 in FIG. 3a can be replaced by a gto, in possible variation of this circuitry. Turn-on is achieved by switching transistor T5 or T6 on by application of a turn-on current across the base-emitter junction which turns on transistor T3 or T4 which, in turn, turns on the main transistor T1 or T2. Simple turn-on is thereby achieved but no reverse base current can be provided for fast, efficient turn-off. This is a particular disadvantage where the device to be controlled is a gto since gto's must have reverse gate current for turn-off.

It is an object of the invention to provide a simple technique for achieving rapid turn-off of a bipolar or field-effect transistor or gate turn-off thyristor (gto) having an emitter or cathode at a floating potential utilising a reverse base or gate current.

SUMMARY OF THE INVENTION

According to the invention the circuit comprises a main bipolar or field-effect transistor or gate turn-off thyristor for conducting a main current by way of its collector-emitter or anode-cathode path on application of on drive to its base or gate, a capacitor connected in parallel with the collector-emitter or anode-cathode path of the main transistor or thyristor, and a switching device coupled to the base or gate of the main transistor or thyristor such that, on removal of on drive from the base or gate of the main transistor or thyristor, the switching device is turned on and a current is caused to flow from the capacitor to the switching device by way of the base or gate of the main transistor or thyristor, thus providing a reverse base or gate current which rapidly turns off the main transistor or thyristor.

By use of this technique a very significant improvement in turn-off time is achieved as compared with conventional circuits, such as that illustrated in FIG. 3a, in which no special provision are made for rapid turn-off. Furthermore the technique is particularly applicable to the turn-off of a gto for which the provision of a reverse gate current is essential. The circuit may take on many different forms depending on the particular application, and may be integrated in a single semiconductor substrate in which case the various components will be formed by different regions of the substrate and many not be physically separated from one another.

In one form of circuit in accordance with the invention a control device is coupled to the main transistor or thyristor and the switching device such that, when a control signal is applied to the control device, the main transistor or thyristor is caused to conduct the main current and the switching device is turned off and, when the control signal is removed from the control device, on drive is removed from the base or gate of the main transistor or thyristor and the switching device is automatically turned on to provide the reverse base or gate current for rapid turn-off of the main transistor or thyristor. This circuit utilises a self-timing approach in which rapid turn-off is automatically initiated on removal of the "on" control signal. The control device may be a field-effect transistor for example.

The circuit may include one or more diodes connected across the base-emitter or gate-cathode junction of the main transistor or thyristor in order to limit the reverse base-emitter or gate-cathode voltage of the main transistor or thyristor. Furthermore, where the switching device is constituted by a first switching transistor, a second switching transistor may be connected in anti-parallel with the first switching transistor such that, when the second switching transistor is turned off, the first switching transistor is turned on to conduct the reverse base or gate current for rapid turn-off of the main transistor or thyristor.

In a development of this form of circuit, in which the switching device is constituted by a switching transistor, a further switching transistor is connected to the switching device to form a Darlington configuration providing a high level of reverse base or gate current for rapid turn-off of the main transistor or thyristor.

In a further development the connections to the main transistor or thyristor and the switching device are such that the base-emitter or gate-cathode junction of the main transistor or thyristor is reverse biased when the switching device is turned on. This is desirable for reliable operation of the transistor or gto.

In another form of circuit in accordance with the invention a supplementary control device is coupled to the switching device such that, when a supplementary control signal is applied to the supplementary control device on removal of the control signal from the main control device, the supplementary control device is turned on to allow a current to flow which causes the switching device to turn on. Such an arrangement enables the power losses to be minimised in the circuit when the main transistor or thyristor is conducting.

In a further form of circuit in accordance with the invention a main transistor and main gate turn-off thyristor are provided in combination, the anode-cathode path of the main thyristor being connected in parallel with the collector-base or anode-gate junction of the main transistor such that on drive is supplied to the main transistor by the main thyristor when the main thyristor is turned on, and such that, when the switching device is turned on after removing gate drive from the main thyristor, a current is caused to flow from the capacitor to the switching device by way of the base or gate of the main transistor and the gate of the main thyristor, thus providing reverse base/gate and gate currents for rapid turn-off of both the main transistor and the main thyristor.

BRIEF DESCRIPTION OF THE DRAWINGS

In order that the invention may be more fully understood, reference will now be made, by way of example, to the accompanying drawings, in which.

DETAILED DESCRIPTION OF THE DRAWINGS

Figure 1A:
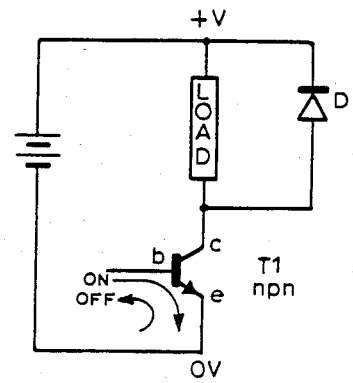
FIGS. 1a, 1b, 2a, 2b, 3a, and 3b show circuits according to the prior art.
Figure 1B:
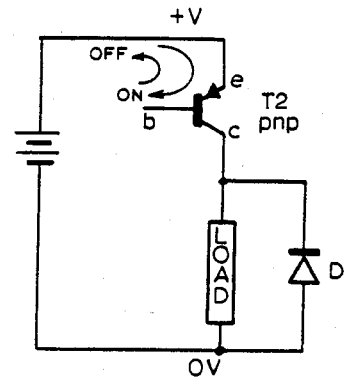
Figure 2A:
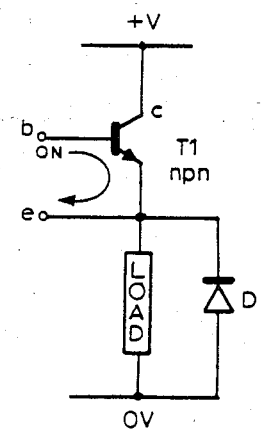
Figure 2B:
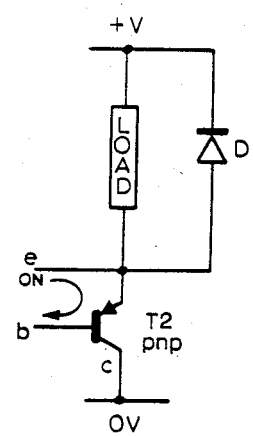
Figure 3A:
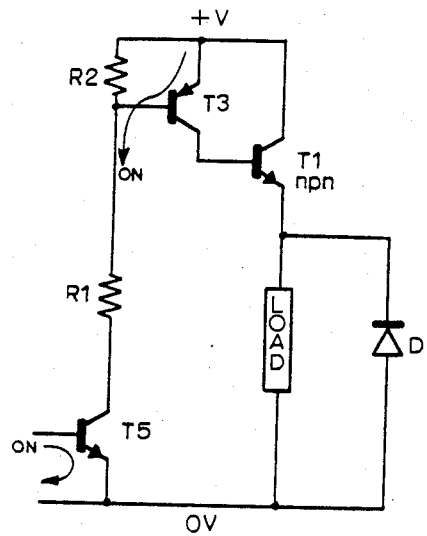
Figure 4:
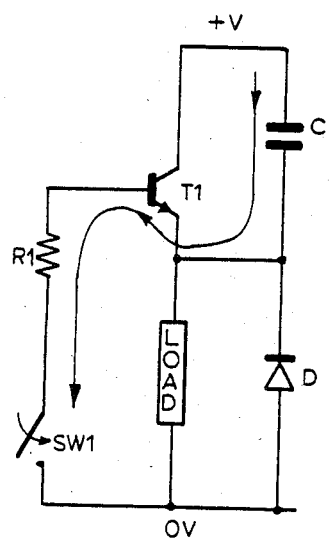
FIG. 4 shows a simplified circuit illustrating the essential features of the invention.

FIG. 4 shows a transistor switching circuit configuration using an npn transistor T1 for supplying a main current by way of its collector-emitter path to a load. The base and emitter are at floating potentials, that is to say their potentials change relative to the 0V rail when the transistor T1 switches on and off. The diode D provides a path for the load current when the transistor T1 is turned off. In order to achieve rapid turn-off of the transistor T1 by providing reverse base current on turn-off, a capacitor C is connected in parallel with the collector-emitter path, and a switch SW1 is connected to the base of the transistor T1 by way of a resistor R1. A normal turn-on circuit, for example as shown in FIG. 3a, is used to provide forward base current for turn-on of the transistor T1.

For turn-off, on drive is removed from the base of the transistor T1 and almost simultaneously switch SW1 is closed. This causes a proportion of the current which flows through capacitor C on turn-off of the transistor T1 to flow through the resistor R1 by way of the base of the transistor T1, thus providing the reverse base current necessary for fast transistor turn-off. The current through the resistor R1, and hence the reverse base current, decreases as the capacitor C is charged up. In this application the capacitor C performs the dual function of providing reverse base current and of reducing switch-off losses in view of the fact that the capacitor serves to shunt a proportion of the current supply to the load as the transistor T1 switches off, thus ensuring that the transistor T1 is not unduly stressed on switch-off.

Figure 5:
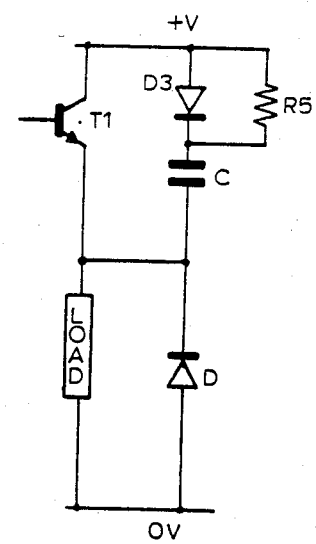
FIG. 5 shows a conventional circuit for reducing switch-off losses.

A switching circuit utilising a capacitor for reducing switch-off losses is known and such a circuit is shown in FIG. 5. This configuration incorporates a capacitor C, a diode D3 and a resistor R5 which serve to shunt current to the load when the transistor T1 turns off in order to reduce the power through the transistor on turn-off. However, it should be stressed that no reverse base current is provided by such a circuit configuration.

FIG. 4 is intended to illustrate the basic principles of the invention and various practical implementations of this concept will now be described with reference to the remaining drawings, the various circuits offering different advantages and features adapted to particular applications.

Figure 6A:
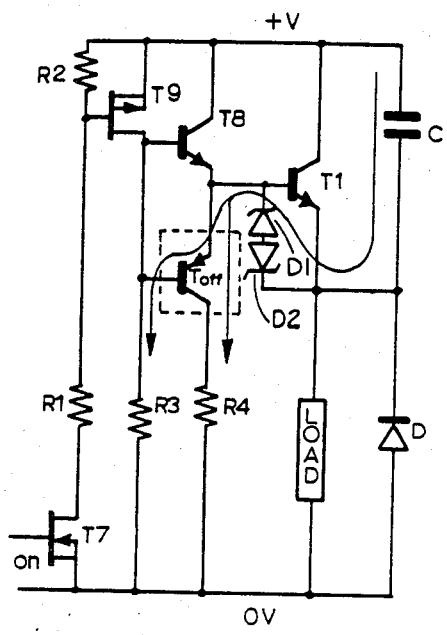
FIGS. 6a, 6b, 7a, 7b, 8a, 8b, 9 and 10 show various practical implementations of the circuit of the invention.

In the circuit illustrated in FIG. 6a, the switch SW1 is replaced by a switching device in the form of a pnp switching transistor $T_{off}$ which is intended to turn on on turn-off of the main transistor T1 in order to provide the required reverse base current in the transistor T1. The circuit employs a self-timing approach in which removal of an "on" control signal from the gate of a control device in the form of a field-effect transistor T7 automatically actuates the reverse current drive circuit. An npn transistor T8 is connected with its base-emitter path in anti-parallel with the base-emitter path of the transistor $T_{off}$, and a further field-effect transistor T9 is connected intermediate the transistors T7 and T8 with its gate biased by resistors R1 and R2. When the transistor T7 turns off on removal of the "on" control signal, the transistor T9 turns off, the transistor T8 turns off and the main transistor T1 begins to turn off. When the transistor T8 turns off, the current drawn by the resistor R3 through the transistor $T_{off}$ from the capacitor C turns on $T_{off}$, and $T_{off}$ conducts a large current via the resistor R4, thus providing the required reverse base current in the transistor T1, as indicated by the arrows in FIG. 6a. A diode D1 and Zener diode D2 are connected across the base-emitter junction of the main transistor T1 to limit the reverse b-e junction voltage of the transistor.

Figure 3B:
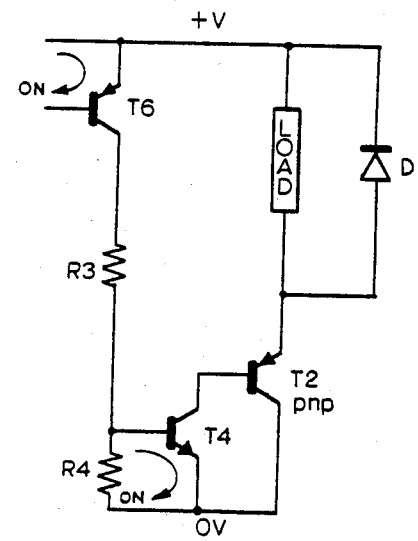
Figure 6B:
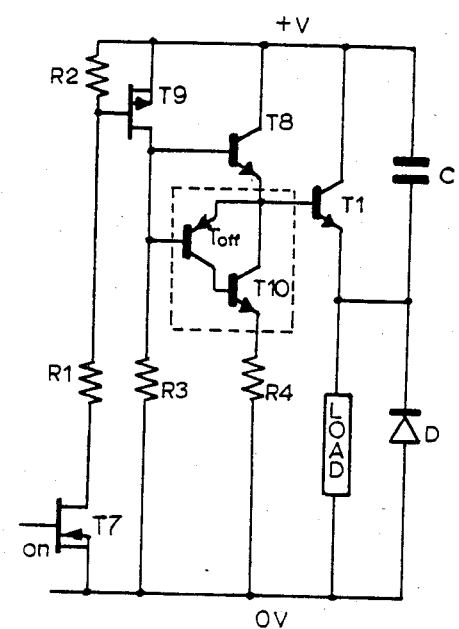

FIG. 6b illustrates a modification of the circuit of FIG. 6a in which an npn transistor T10 is used in conjunction with the pnp transistor $T_{off}$ to form a Darlington configuration having a high reverse current capability for turn-off of the main transistor T1. In either of these circuits, or in any of the circuits still to be described, the pnp transistor $T_{off}$ can be replaced by a p-channel field-effect transistor. Furthermore an npn transistor or an n-channel field-effect transistor can be used in similar circuitry for turn-off of the pnp transistor T2 of FIG. 3b.

Figure 7A:
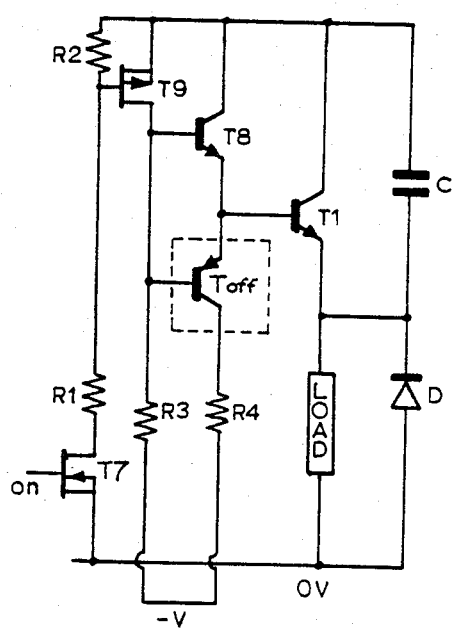
Figure 7B:
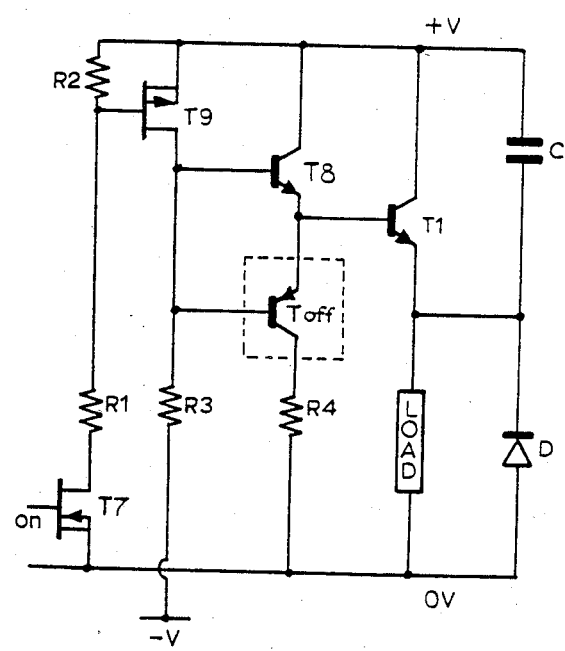

If the turn-off circuit resistors R3 and R4 are connected to a potential slightly lower than the 0V rail, as shown in the alternative circuits of FIGS. 7a and 7b, the transistor T1 has its b-e junction reverse-biased in the off-state. This is a desirable condition for robust and reliable transistor operation (and for operation of a gto where such a device is used instead of the transistor T1).

In the circuits of FIGS. 6a, 6b, 7a and 7b, the resistor R3 draws current through the transistor T9 when the main transistor T1 is on. If the duty cycle of the transistor T1 is high, the power dissipated in the resistor R3 may be high. In order to reduce these losses and hence provide energy saving, arrangements such as those illustrated in FIGS. 8a and 8b may be utilised. In these circuits a supplementary control device in the form of a field-effect transistor T11 is connected between the resistor R3 and the 0V or −V rail, and an "off" control signal $\overline{Q}$ is applied to the gate of the transistor T11 in order to turn the transistor T11 on when the "on" control signal Q is removed from the gate of the transistor T7 in order to turn that transistor T7 off. This then enables the transistor $T_{off}$ to be turned on for rapid turn-off of the transistor T1. Since the transistor T11 is turned off when the main transistor T1 is turned on, current is no longer drawn through the transistor T9 by the resistor R3 when the main transistor T1 is on and significant energy saving results. The circuit of FIG. 8b also incorporates the feature of reverse b-e junction biasing.

Figure 9:
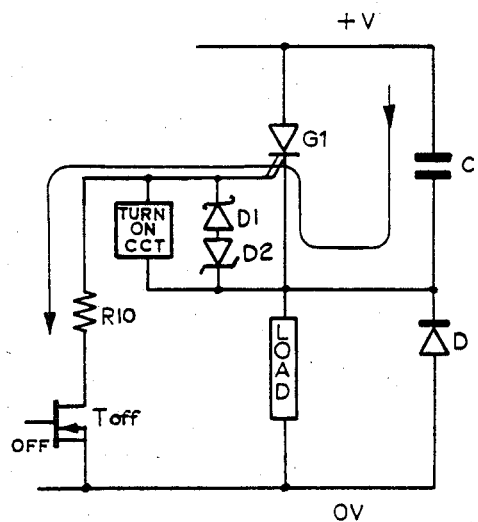

The main transistor T1 may be replaced by a gto in any of the above described circuit arrangements which are well adapted to the turn-off of a gto since they provide the necessary reverse gate current. FIG. 9 shows a circuit in accordance with the invention utilising a gto G1 in which conventional turn-on circuitry is utilised for turning on the gto G1, and a gate resistor R10 is provided to limit the reverse gate current. When a control signal is applied to the gate of the field-effect transistor $T_{off}$, the transistor $T_{off}$ is turned on thus providing a flow of current from the capacitor C to the transistor $T_{off}$ by way of the gate of the gto G1 and the resistor R10, this reverse gate current ensuring rapid turn-off of the gto G1 after removal of the gate drive.

Figure 10:
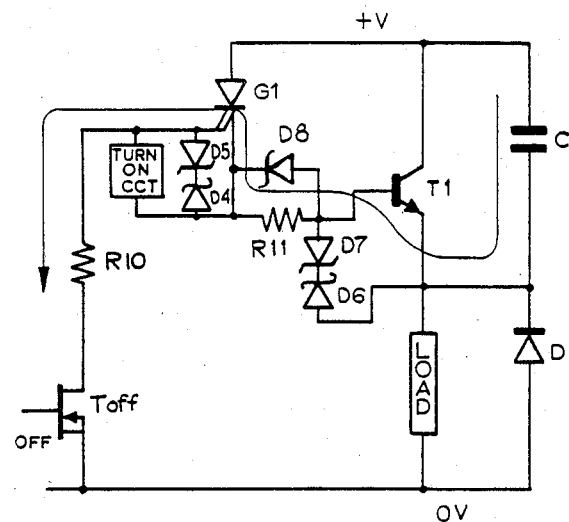

FIG. 10 shows a circuit utilising a gto-npn transistor switch combination G1, T1. The gto G1 is used to provide the on-base current for the npn transistor T1, the gto G1 itself being turned on by conventional turn-on circuitry. Turn-off is achieved by turning on the transistor $T_{off}$ after the gto gate drive is removed. Both the gto G1 and the transistor T1 are turned off by the resultant reverse current which flows from the capacitor C, as shown by the arrow in FIG. 10. In this circuit the diodes D4, D5, D6 and D7 perform the same functions as the diodes D1 and D2 in the circuits of FIGS. 6a and 9. The diode D8 and resistor R11 also provide added protection for the transistor T1.

Figure 8A:
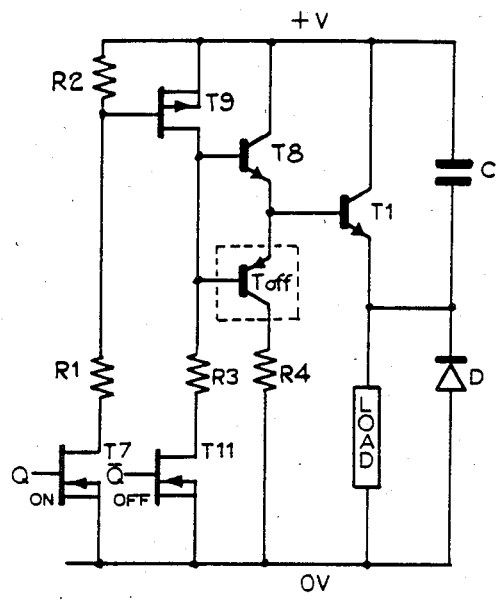
Figure 8B:
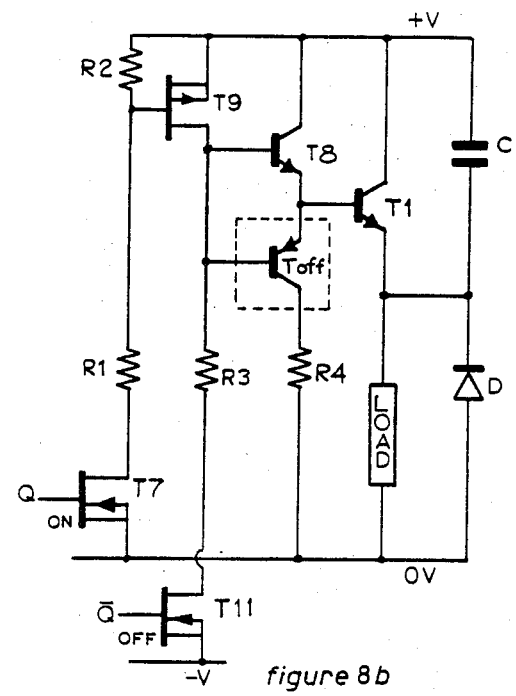

It has been found that, when the circuit of FIG. 8a, for example, is used with a 150V dc supply and a 20A load current, the collector current of the transistor T1 decreases from 20A to 0A, after a storage time of 1.5 microseconds, with a fall time of 0.2 microseconds, and the collector voltage increases from near zero volts to 150V dc during the fall time. These results were obtained with a switching frequency of 2 kHz and a snubber capacitance of 0.2 microfarads, and compare with a current fall time of 1 microsecond and a storage time of 4 microseconds when a transistor was turned off under similar conditions but without utilising the reverse base current technique of the invention. The improved performance results from a 3A reverse base current provided for fast turn-off. Particular advantages are obtained by such an arrangement since, the faster the current fall time, the lower the turn-off switching losses. This also enables a smaller value snubber capacitance to be utilised, as well as allowing the transistor to be operated at a higher frequency than would be possible if the reverse base current technique was not used. The turn-off circuitry is therefore of particular application in choppers and inverters.

We claim:

1. A switch-off circuit for a main semi-conductor power switch having two power-conducting terminals and a control terminal, said circuit comprising source terminals for connection to a power source, load terminals for connection to a load, said switch being connected intermediate the source and load terminals such that the two power-conducting terminals of the switch form a series combination with the load terminals connected across the source terminals, said switch having one of its first or second power-conducting terminals at a floating potential and serving to conduct a main current by way of its two power-conducting terminals on application of an "on" drive signal to its control terminal, a capacitor connected in parallel with said two power-conducting terminals of said switch, and a secondary switching device connected to the control terminal of the said switch, whereby, on removal of said "on" drive signal from the control terminal of the said switch, the secondary switching device is turned on and a current is caused to flow from the capacitor to the secondary device by way of the control terminal of the said power switch, thus providing a reverse bias current which rapidly turns off the said switch.

2. Circuit according to claim 1, and a control device coupled to said main power switch and said secondary switching device such that, when a control signal is applied to the control device, said main power switch is caused to conduct the main current and the secondary switching device is turned off and, when the control signal is removed from the control device, said "on" drive signal is removed from the control terminal of the said main switch and the secondary switching device is automatically turned on to provide the reverse bias current for rapid turn-off of the said main power switch.

3. A circuit according to claim 2, wherein the said control device is a field effect transistor.

4. A circuit according to claim 1, wherein said main semi-conductor power switch is a bi-polar transistor.

5. A circuit according to claim 1, wherein said main semi-conductor power switch is a gate turn-off thyristor.

* * * * *